United States Patent
Yang

(10) Patent No.: US 10,110,201 B2
(45) Date of Patent: Oct. 23, 2018

(54) SURFACE ACOUSTIC WAVE FILTER DEVICES

(71) Applicant: AIROHA TECHNOLOGY CORP., Hsinchu (TW)

(72) Inventor: Chin-Lung Yang, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 128 days.

(21) Appl. No.: 15/137,111

(22) Filed: Apr. 25, 2016

(65) Prior Publication Data

US 2017/0077901 A1    Mar. 16, 2017

Related U.S. Application Data

(60) Provisional application No. 62/219,495, filed on Sep. 16, 2015.

(51) Int. Cl.
*H03H 9/64* (2006.01)
*H03H 9/02* (2006.01)
*H03H 9/00* (2006.01)

(52) U.S. Cl.
CPC ........ *H03H 9/6436* (2013.01); *H03H 9/0038* (2013.01); *H03H 9/0057* (2013.01);
(Continued)

(58) Field of Classification Search
CPC ............... H03H 9/0038; H03H 9/0057; H03H 9/02818; H03H 9/02866; H03H 9/6436; H03H 9/6489; H03H 9/644; H03H 9/6446
(Continued)

(56) References Cited

U.S. PATENT DOCUMENTS 5,790,000 A * 8/1998 Dai ...................... H03H 9/0038
                                                        310/313 B
6,744,333 B2 * 6/2004 Sawada ................ H03H 9/0038
                                                        310/313 D
(Continued)

FOREIGN PATENT DOCUMENTS

JP       60-236313 A  * 11/1985
JP       05-183370    *  7/1993
JP     2012-015776 A  *  1/2012

OTHER PUBLICATIONS

English language machine translation of JP 2012-015776, published Jan. 19, 2012, 5 pages.*

(Continued)

*Primary Examiner* — Barbara Summons
(74) *Attorney, Agent, or Firm* — Rosenberg, Klein & Lee

(57) ABSTRACT

The present invention relates to a surface acoustic wave filter device with floating units. The surface acoustic wave filter device comprises a piezoelectric substrate, at least one interdigitated transducer configuration and at least one floating unit. The interdigitated transducer configuration comprises a plurality of interdigitated transducer units disposed on the piezoelectric substrate. The floating unit is disposed between adjacent interdigitated transducer units, and covers partial region of adjacent interdigitated transducer units to reduce the BAW scattering of the surface acoustic wave filter device, and can be used to improve the amplitude and phase balances of the surface acoustic wave filter devices.

13 Claims, 9 Drawing Sheets

(52) U.S. Cl.
CPC .... *H03H 9/02818* (2013.01); *H03H 9/02866* (2013.01); *H03H 9/644* (2013.01); *H03H 9/6489* (2013.01)

(58) Field of Classification Search
USPC .................. 333/193–195; 310/313 B, 313 D
See application file for complete search history.

(56) References Cited

U.S. PATENT DOCUMENTS

| | | | | |
|---|---|---|---|---|
| 7,245,193 | B2 * | 7/2007 | Funasaka | H03H 9/02574 333/193 |
| 7,679,474 | B2 * | 3/2010 | Igaki | H03H 9/14544 310/313 D |
| 7,939,987 | B1 * | 5/2011 | Solal | H03H 9/02118 310/313 B |
| 7,940,147 | B2 * | 5/2011 | Yasuda | H03H 9/0038 310/313 D |
| 8,427,258 | B2 * | 4/2013 | Tanaka | H03H 9/0038 310/313 D |
| 2010/0188173 | A1 * | 7/2010 | Matsuda | H03H 3/08 333/193 |

OTHER PUBLICATIONS

English language machine translation of JP 60-236313, published Nov. 25, 1985, 5 pages.*

* cited by examiner

SURFACE ACOUSTIC WAVE FILTER DEVICES

REFERENCE TO RELATED APPLICATIONS

This application is based on Provisional application Ser. No. 62/219,495, filed Sep. 16, 2015, currently pending.

FIELD OF THE INVENTION

The present invention relates to a surface acoustic wave filter device with floating units to reduce the bulk acoustic wave (BAW) scattering of the surface acoustic wave filter device and improve the amplitude and phase balances of the surface acoustic wave filter device.

BACKGROUND

In recent years, surface acoustic wave filters have been used for bandpass filters in an RF module of portable electronic devices, such as cell phones, smart phones and tablet computers.

FIG. 1 is a plan view diagram of a common surface acoustic wave filter device. The surface acoustic filter (SAW) device 10 comprises a first interdigitated transducer (IDT) configuration 11, a second interdigitated transducer (IDT) configuration 13 and a piezoelectric substrate 15. The first IDT configuration 11 and the second IDT configuration 13 are arranged on the piezoelectric substrate 15, and the first IDT configuration 11 and the second IDT configuration 13 are adjacent to each other.

The first IDT configuration 11 comprises two facing comb-shaped electrodes 111/113, and the second IDT configuration 13 comprises two facing comb-shaped electrodes 131/133. When an input voltage Vin is applied to the first comb-shaped electrode 111 and the second comb-shaped electrode 113, a surface acoustic wave is generated on the surface of the piezoelectric substrate 15 and is transmitted from the IDT configuration 11 to the second IDT configuration 13 via a gap 12. Then, the second IDT configuration 13 convers the surface acoustic wave to an output voltage Vout.

However, the surface acoustic wave that is transmitted from the first IDT configuration 11 to the second IDT configuration 13 via a gap 12 may be scattering into the piezoelectric substrate 15, causing BAW Scattering and insertion loss.

SUMMARY

It is one object of the present invention to provide a surface acoustic wave filter device. A plurality of IDT units are arranged on a piezoelectric substrate in order, and a floating unit is disposed between two adjacent IDT units and covers partial region of adjacent IDT units to reduce BAW scattering without increasing size of the surface acoustic wave filter device.

It is one object of the present invention to provide a surface acoustic wave filter device. The floating unit is disposed between two adjacent IDT units and covers partial region of adjacent IDT units of a longitudinal-coupled resonator type surface acoustic wave filter device to improve amplitude and phase balances thereof.

For achieving above objects, the present invention provides a surface acoustic wave filter device, comprising: a piezoelectric substrate; at least one interdigitated transducer configuration comprising a plurality of interdigitated transducer units arranged on the piezoelectric substrate in order; and at least one floating unit disposed between adjacent interdigitated transducer units to cover partial range of adjacent interdigitated transducer units.

The present invention provides another surface acoustic wave filter device, comprising: a piezoelectric substrate; a plurality of interdigitated transducer configurations comprising a plurality of interdigitated transducer units arranged on the piezoelectric substrate along a first direction in order, wherein the interdigitated transducer configurations are arranged on the piezoelectric substrate along a second direction in order, and the first direction is perpendicular to the second direction; and a plurality of floating plates disposed between adjacent interdigitated transducer units to cover partial range of adjacent interdigitated transducer units.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which.

DETAILED DESCRIPTION OF THE PREFERRED EMBODIMENTS

Figure 1:
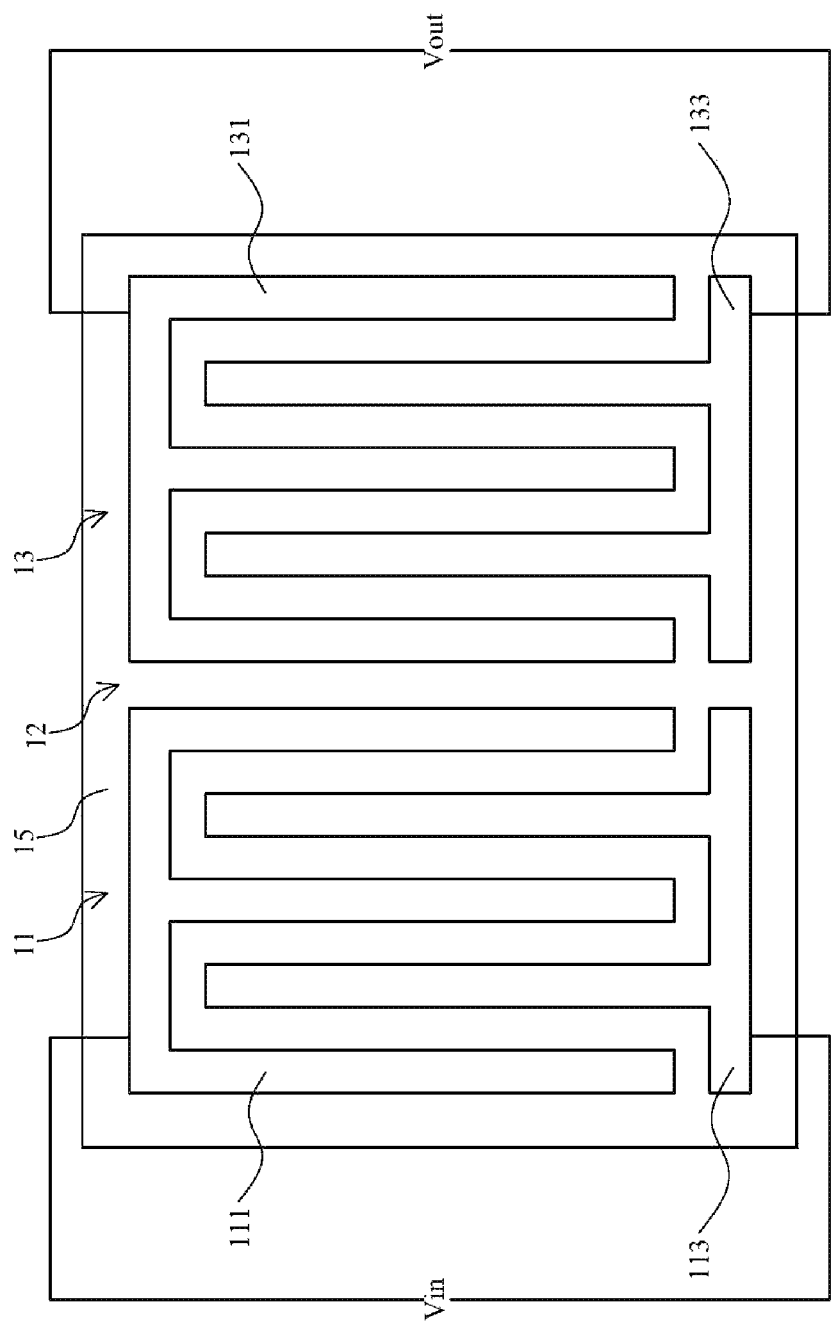
FIG. 1 is a plan view diagram of a common surface acoustic wave filter device.
Figure 2:
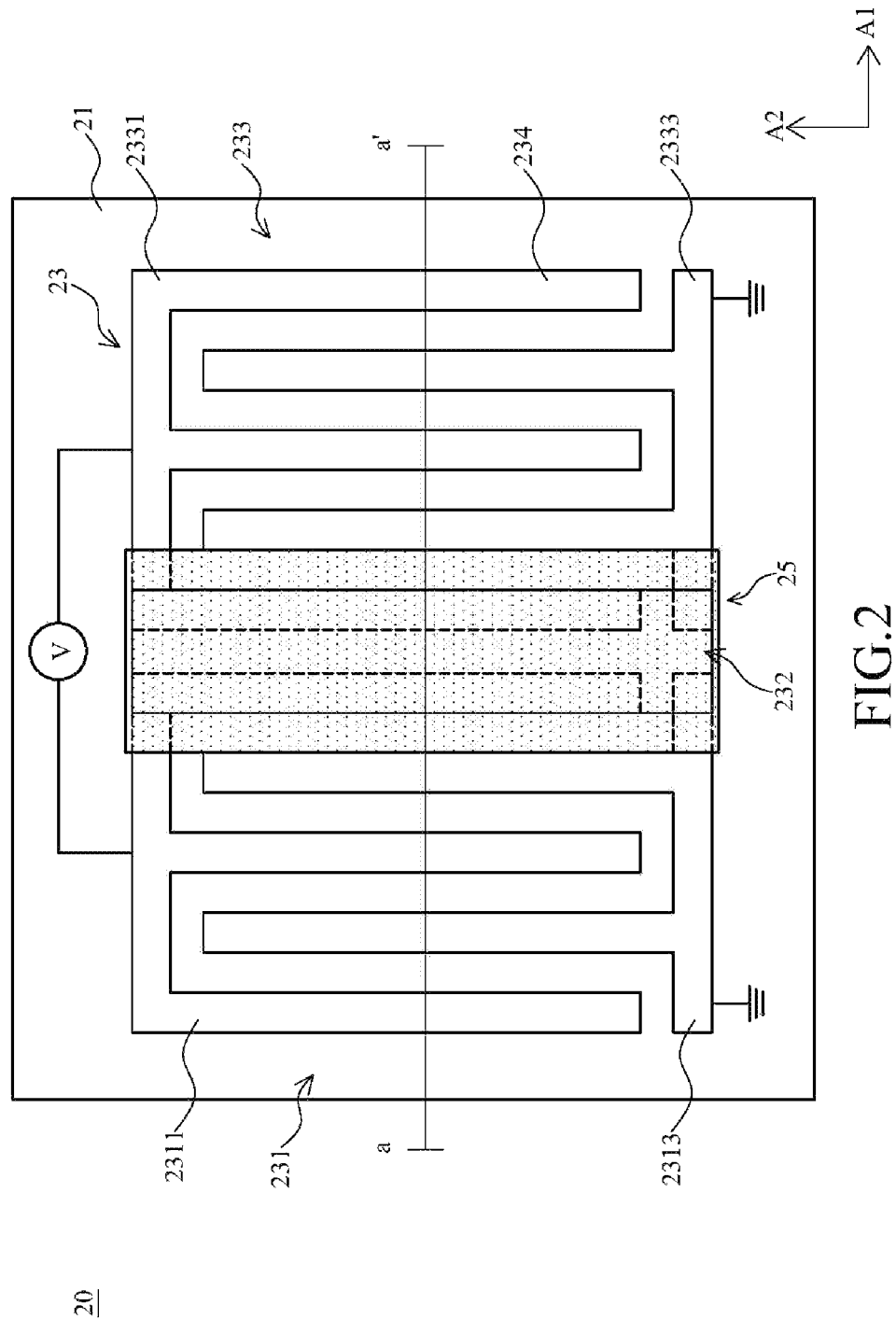
FIG. 2 is a perspective view diagram of a surface acoustic wave filter device according to a first embodiment of the invention.
Figure 3:
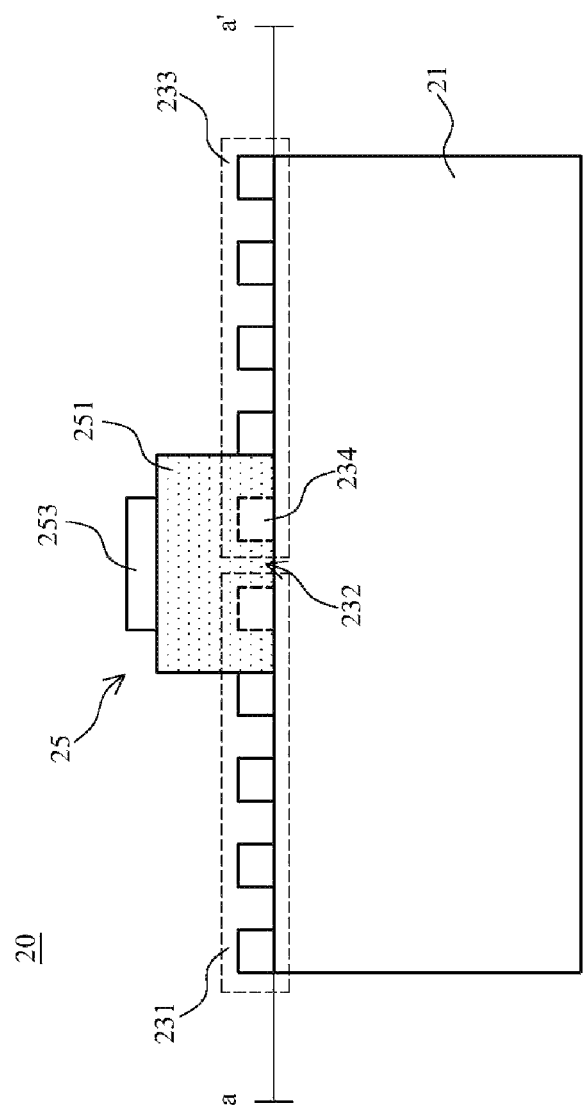
FIG. 3 is a cross-section diagram of a surface acoustic wave filter device according to the first embodiment of the invention.

FIG. 2 is a perspective view diagram of a surface acoustic wave filter device according to a first embodiment of the invention. FIG. 3 is a cross-section diagram of a surface acoustic wave filter device according to the first embodiment of the invention. The surface acoustic wave (SAW) filter device 20 comprises a piezoelectric substrate 21, at least one interdigitated transducer (IDT) configuration 23 and at least one floating unit 25.

In one embodiment of the invention, the IDT configuration 23 comprises a plurality of IDT units 231/233 arranged on the piezoelectric substrate 21 in order. For example, IDT units may comprise a first IDT unit 231 and a second IDT unit 233 arranged on the piezoelectric substrate 21, and the first IDT unit 231 is adjacent to the second IDT unit 233. Further, there is a gap 232 formed between each adjacent IDT units, such as between the first IDT unit 231 and the second IDT unit 233. Specifically, each IDT unit 231/233 may comprise two facing comb-shaped electrodes 2311/2313/2331/2333, such as the first facing comb-shaped electrode 2311 and the second facing comb-shaped electrode 2313 locked into each other and the third facing comb-shaped electrode 2331 and the fourth facing comb-shaped electrode 2333 locked into each other. Further, each comb-shaped electrode 2311/2313/2331/2333 may comprise a plurality of electrode fingers 234.

The piezoelectric substrate 21 material may comprise quartz, lithium tantalite (LiTaO$_3$), lithium niobate (LiNbO$_3$), or laminated-compound substrate comprised AlN and diamond. When a voltage V, such as alternating voltage, is applied to the first IDT unit 231 and/or the second IDT unit 233, a surface acoustic wave will be generated on the surface of the piezoelectric substrate 21. The propagation direction of the surface acoustic wave is along a first direction A1, and the first direction A1 may be approximately perpendicular to the electrode fingers 234 of the IDT units 231/233. IDT units 231/233 are arranged on the piezoelectric substrate 21 along the propagation direction (the first direction A1) of the surface acoustic wave.

In particularly, the first IDT unit 231 and the second IDT unit 233 are arranged on the piezoelectric substrate 21 along the propagation direction of the surface acoustic wave, such as the first direction A1, and the first IDT unit 231 is adjacent to the second IDT unit 233. Further, the gap 232 is formed between the first IDT unit 231 and the second IDT unit 233.

Figure 4:
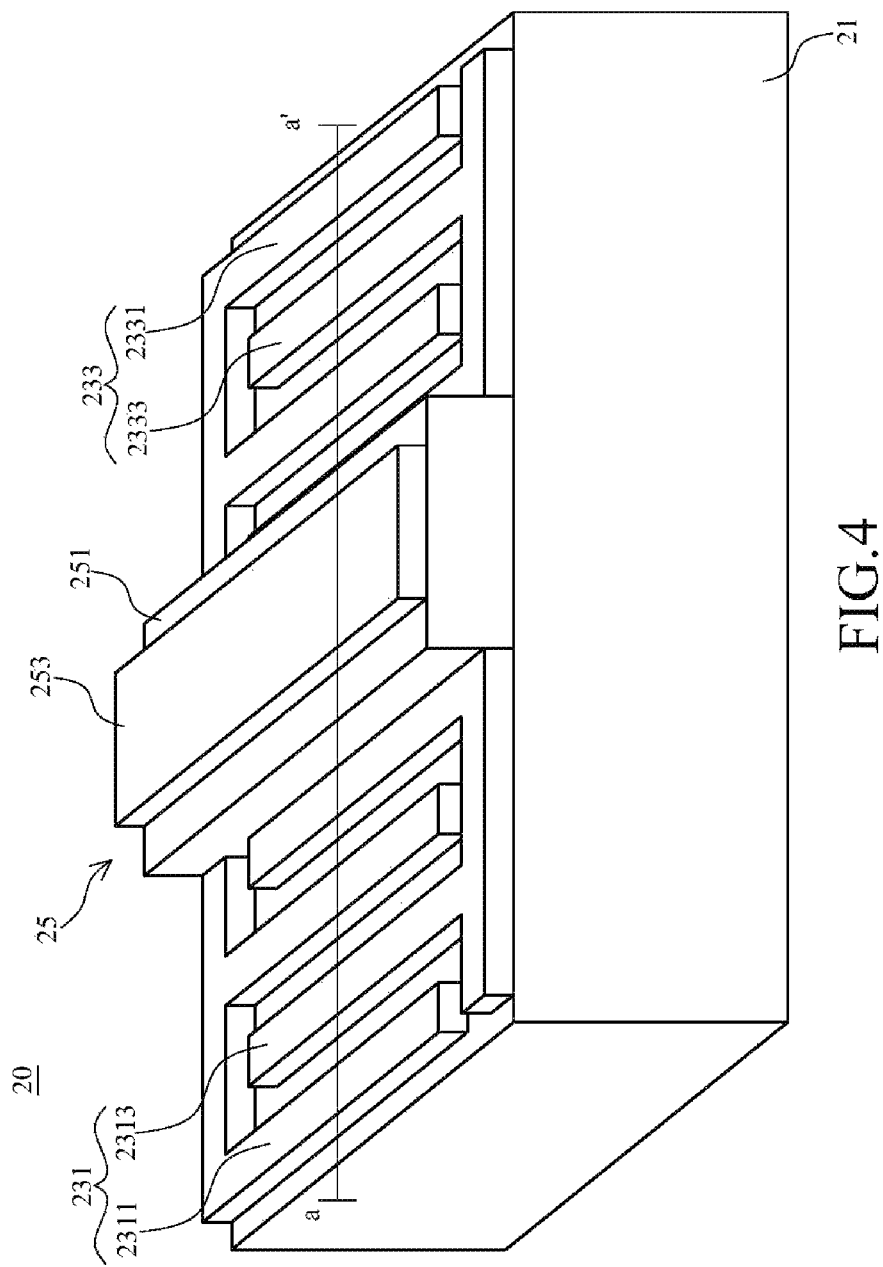
FIG. 4 is a three-dimensional diagram of a surface acoustic wave filter device according to the first embodiment of the invention.
Figure 5:
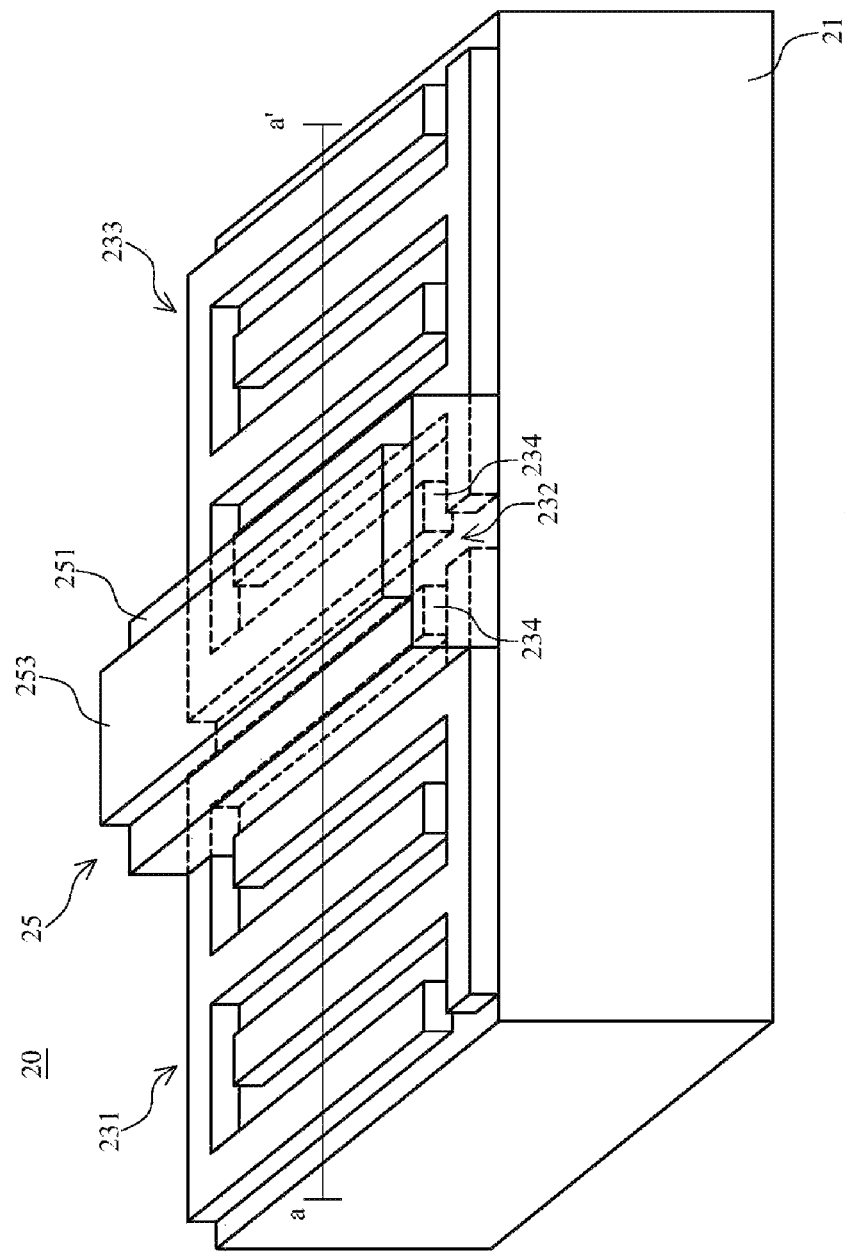
FIG. 5 is a three-dimensional perspective diagram of a surface acoustic wave filter device according to the first embodiment of the invention.

The floating unit 25 is disposed between two adjacent IDT units 231/233, and covers partial region of adjacent IDT units 231/233, as shown in FIGS. 3, 4 and 5. Thus, the propagated energy of the surface acoustic wave into the piezoelectric substrate 21 and the BAW scattering of the SAW filter device 20 are able to be reduced, and the amplitude and phase balances of the SAW filter device 20 are able to be improved by disposition of the floating unit 25. Most of all, the size or area of the SAW filter device 20 will not increase.

In one embodiment of the invention, the floating unit 25 may comprise an isolation layer 251 (or a passivation layer) and a conductive layer 253. Please referring to FIG. 3 to FIG. 5, the isolation layer 251 covers the gap 232 and/or partial region of adjacent IDT units 231/233, and the conductive layer 253 is disposed on the isolating layer 251. Further, the conductive layer 253 overlaps partial region of adjacent IDT units 231/233, and the isolation layer 251 is able to isolate the conductive layer 253 from the IDT configuration 23 and/or other device. Specifically, the conductive layer 253 of the floating unit 25 overlaps adjacent electrode fingers 234 of adjacent IDT units 231/233 completely or partially.

In one embodiment of the invention, IDT unit 231/233 may comprise a plurality of electrode fingers 234, and the floating unit 25 covers at least one electrode finger 234 of the first IDT unit 231 and at least one electrode finger 234 of the second IDT unit 233 that are adjacent to each other. For example, the isolating layer 251 covers at least one electrode finger 234 of the first IDT unit 231 and at least one electrode finger 234 of the second IDT unit 233 that are adjacent to each other, and the conductive layer 253 is disposed on the isolation layer 251 and overlaps at least one electrode finger 234 of the first IDT unit 231 and at least one electrode finger 234 of the second IDT unit 233 that are adjacent to each other.

In other embodiment of the invention, the isolating layer 251 may cover more than one electrode finger 234 of the first IDT unit 231 and the second IDT unit 233, and the conductive layer 253 disposed on the isolation layer 251 may overlap more than one electrode finger 234 of the first IDT unit 231 and the second IDT unit 233. Thus, the admittance characteristics and quality factor of the IDT configuration 23 are able to be adjusted in accordance to the overlapped area between the conductive layer 253 and the IDT units 231/233 or the electrode finger 234 thereof.

Figure 6:
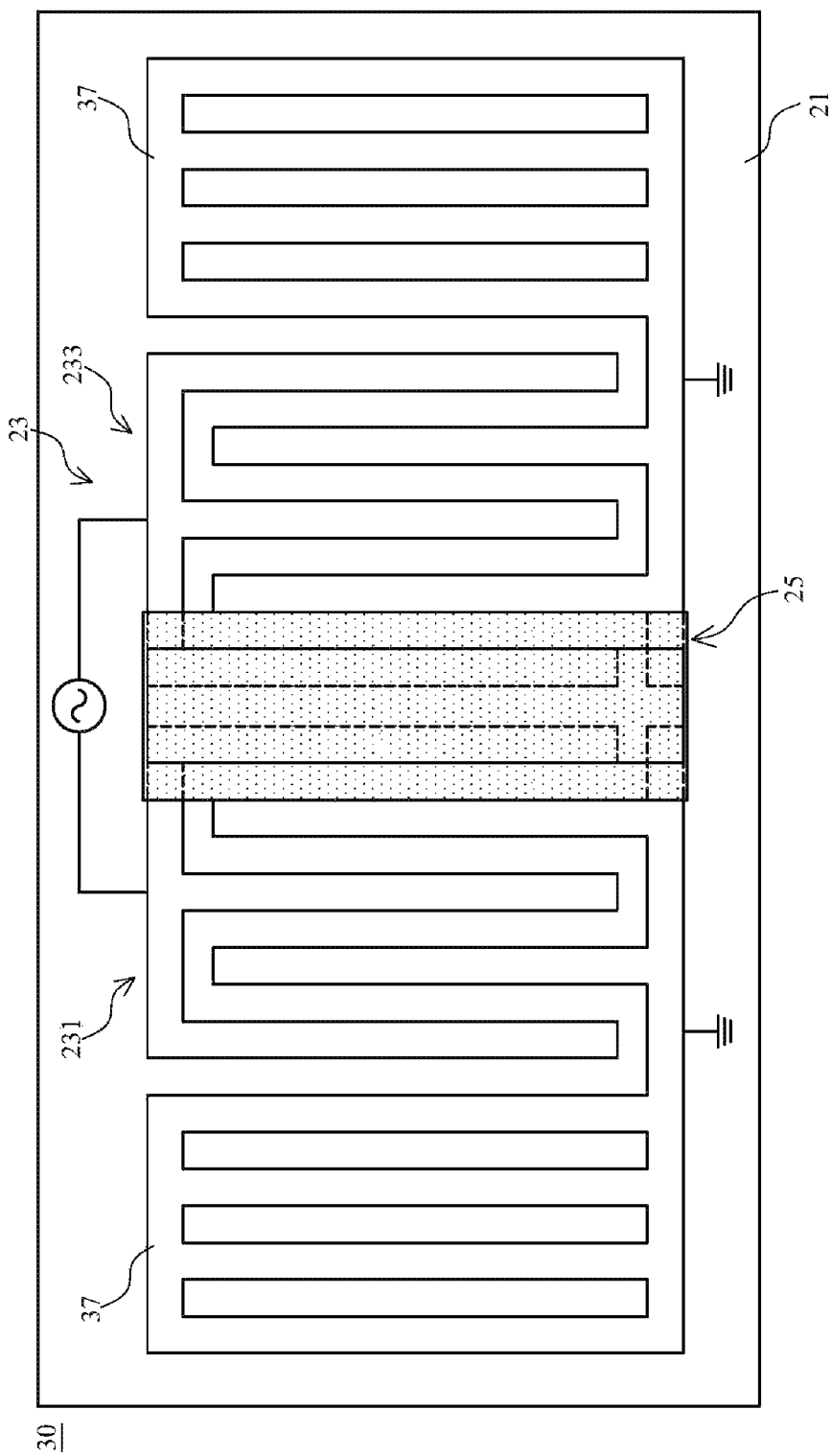
FIG. 6 is a perspective view diagram of a surface acoustic wave filter device according to a second embodiment of the invention.

FIG. 6 is a perspective view diagram of a surface acoustic wave filter device according to a second embodiment of the invention. The surface acoustic wave (SAW) filter device 30 comprises a piezoelectric substrate 21, at least one inter-digitated transducer (IDT) configuration 23, at least one floating unit 25 and a plurality of grating reflectors 37.

The IDT configuration 23 is arranged on the piezoelectric substrate 21, and two grating reflectors 37 are disposed two sides of the IDT configuration 23 respectively. For example, the IDT configuration 23 comprises a plurality of IDT units 231/233 arranged one the piezoelectric substrate 21 in order, and two grating reflectors 37 are disposed two sides of those IDT units 231/233 arranged on the piezoelectric substrate 21 in order respectively.

In particularly, the IDT configuration 23 may comprises a first IDT unit 231 and a second IDT unit 233 arranged on the piezoelectric substrate 21, and the first IDT unit 231 is adjacent to the second IDT unit 233. Further, one grating reflector 37 is arranged on the piezoelectric substrate 21 and adjacent to the first IDT unit 231, and the other grating reflector 37 is arranged on the piezoelectric substrate 21 and adjacent to the second IDT unit 233.

In one embodiment of the invention, two grating reflectors 37 may be connected to the closest IDT unit respectively. For example, one grating reflector 37 is connected to the first IDT unit 231, and the other grating reflector 37 is connected to the second IDT unit 233.

Figure 7:
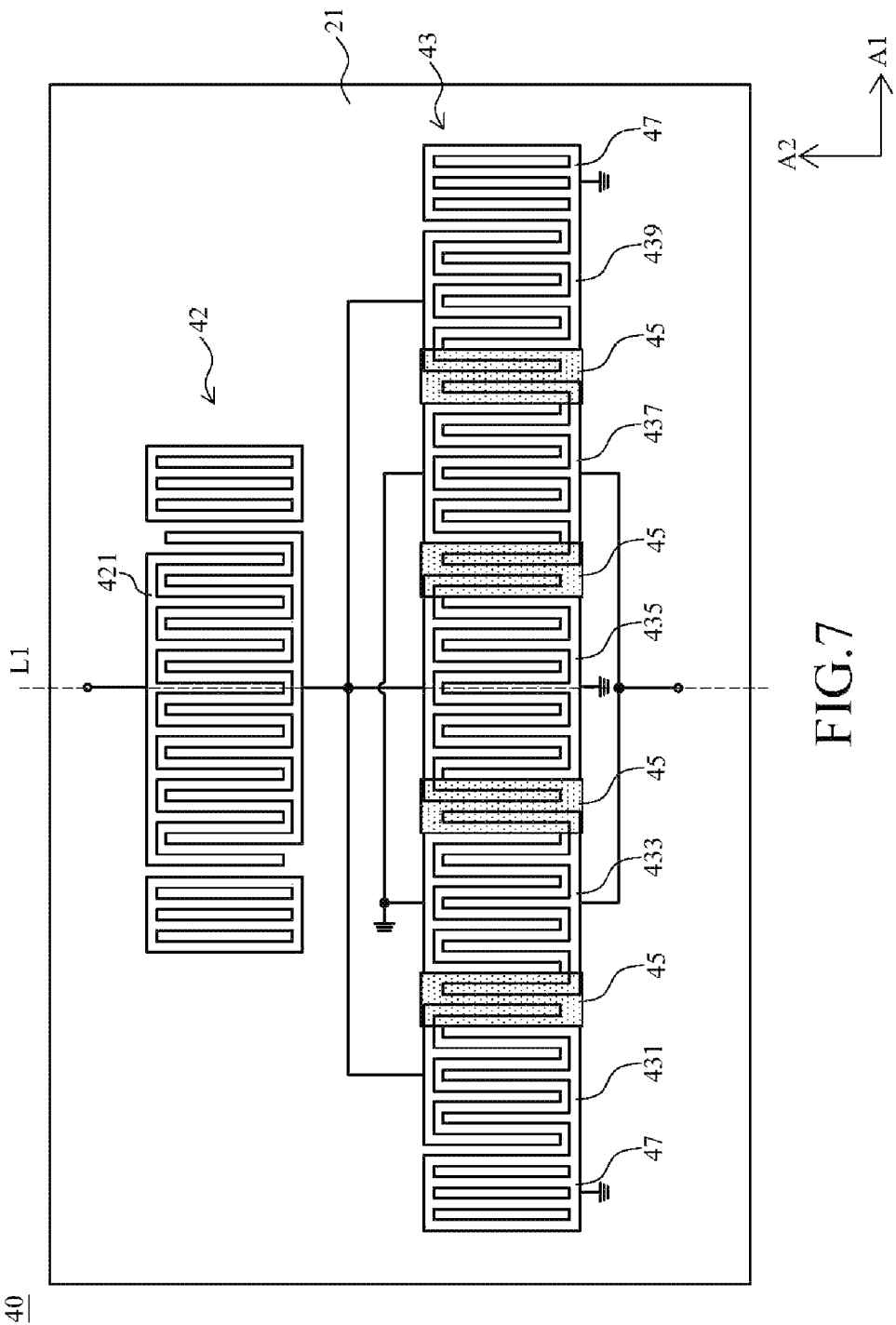
FIG. 7 is a perspective view diagram of a surface acoustic wave filter device according to a third embodiment of the invention.

FIG. 7 is a perspective view diagram of a surface acoustic wave filter device according to a third embodiment of the invention. The surface acoustic wave (SAW) filter device 40 comprises a piezoelectric substrate 21, a plurality of inter-digitated transducer (IDT) configurations 42/43, at least one floating unit 45 and a plurality of grating reflectors 47. For example, the IDT configurations may comprise a first IDT configuration 42 and a second IDT configuration 43.

In one embodiment of the invention, the second IDT configurations 43 may comprise a plurality of IDT units 431/433/435/437/439 arranged on the piezoelectric substrate 21 in order. For example, IDT units 431/433/435/437/439 are arranged on the piezoelectric substrate 21 along propagation direction of the surface acoustic wave in order, such as the first direction A1.

The IDT configurations 42/43 may be arranged on the piezoelectric substrate 21 along the second direction A2 in order, wherein the second direction A2 may be approximately perpendicular to the first direction A1 and/or the propagation direction of the surface acoustic wave. For example, the first IDT configuration 42 and the second IDT configuration 43 are arranged on the piezoelectric substrate 21 along the second direction A2 in order, the first IDT configuration 42 is adjacent to the second IDT configuration 43, and the first IDT configuration 42 is electrically connected to the second IDT configuration 43. Thus, the SAW filter device 40 may be a longitudinally coupled-type SAW filter.

In this embodiment of the invention, each floating unit 45 is disposed between each adjacent IDT units 431/433/435/

437/439 of the second IDT configuration 43, and covers partial region of each adjacent IDT units 431/433/435/437/439. For example, the IDT configuration 43 may comprise a first IDT unit 431, a second IDT unit 433, a third IDT unit 435, a fourth IDT unit 437 and a fifth IDT unit 439 arranged on the piezoelectric substrate 21 along the first direction A1 in order, and each floating unit 45 is disposed between the first IDT unit 431 and the second IDT unit 433, the second IDT unit 433 and the third IDT unit 435, the third IDT unit 435 and the fourth IDT unit 437, and the fourth IDT unit 437 and the fifth IDT unit 439 respectively. Further, the first IDT configuration 42 only comprises an IDT unit 421, and thus it is unnecessary to dispose the floating unit on the IDT unit 421 or the first IDT configuration 42.

Thus, the BAW (Bulk Acoustic Wave) scattering of the SAW filter device 40 is able to be reduced, and the amplitude and phase balances of the SAW filter device 40 are able to be improved by disposition of the floating unit 45. Most of all, the size or area of the SAW filter device 40 will not be increased.

In one embodiment of the invention, the IDT configuration 43 may be a synchronous IDT structure, as shown in FIG. 7. For example, a line of symmetry L1 divides the IDT configuration 43 into two pieces which are mirror images of each other. Further, each floating unit 45 is disposed between each adjacent IDT unit 431/433/435/437/439.

Figure 8:
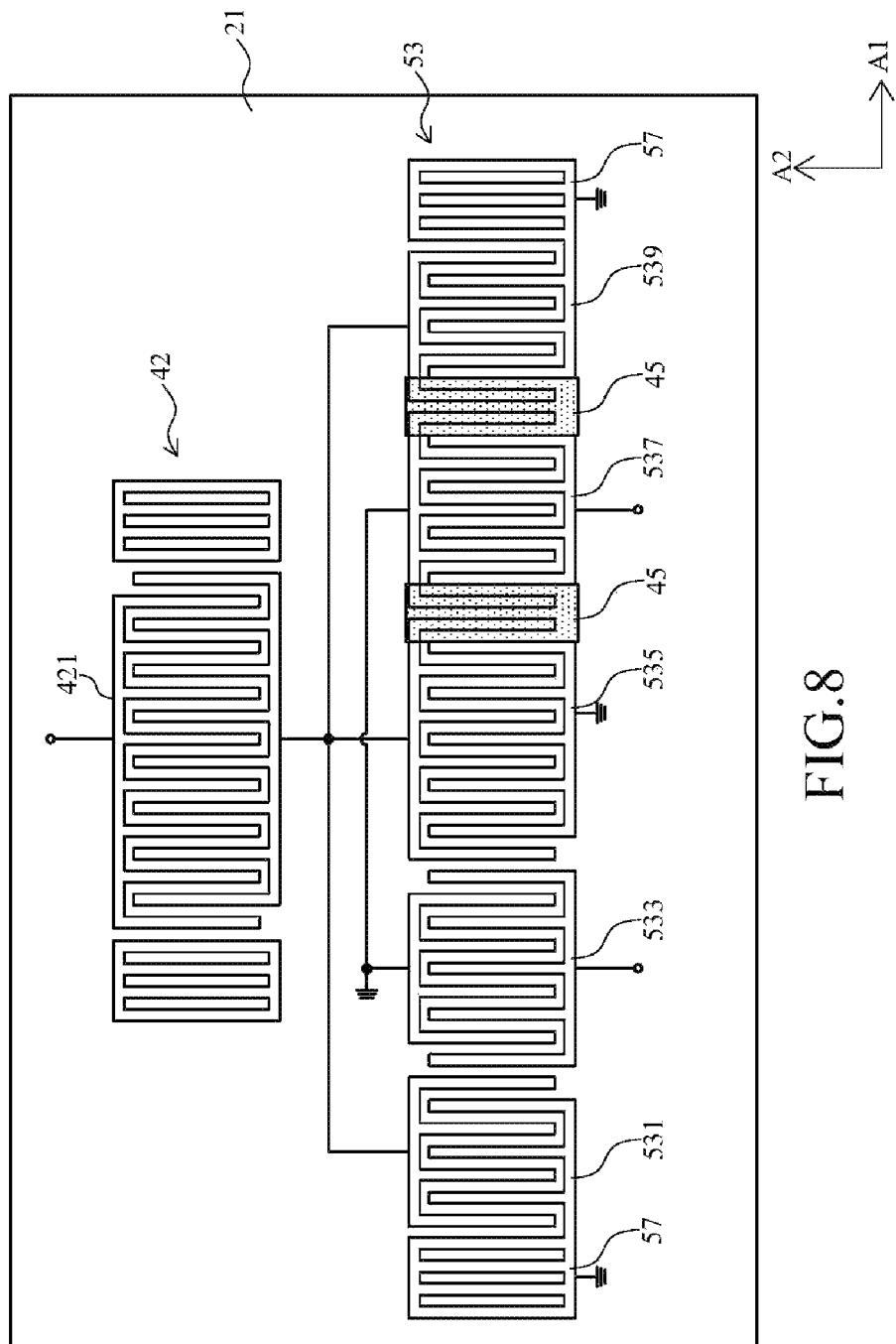
FIG. 8 is a perspective view diagram of a surface acoustic wave filter device according to a fourth embodiment of the invention.

FIG. 8 is a perspective view diagram of a surface acoustic wave filter device according to a fourth embodiment of the invention. The surface acoustic wave (SAW) filter device 50 comprises a piezoelectric substrate 21, a plurality of interdigitated transducer (IDT) configurations 42/53, at least one floating unit 45 and a plurality of grating reflectors 57. For example, the IDT configurations may comprise a first IDT configuration 42 and a second IDT configuration 53. In the embodiment of the invention, the second IDT configuration 53 may be a non-synchronous interdigital structure.

In one embodiment of the invention, the second IDT configurations 53 may comprise a plurality of IDT units 531/533/535/537/539 arranged on the piezoelectric substrate 21 in order. For example, IDT units 531/533/535/537/539 are arranged on the piezoelectric substrate 21 along propagation direction of the surface acoustic wave in order, such as the first direction A1.

The IDT configurations 42/53 may be arranged on the piezoelectric substrate 21 along the second direction A2 in order, wherein the second direction A2 may be approximately perpendicular to the first direction A1 and/or the propagation direction of the surface acoustic wave. Thus, the SAW filter device 50 may be a longitudinally coupled-type SAW filter.

Further, partial two adjacent IDT units 535/537/539 may be cover by the floating unit 45. For example, the second IDT configuration 53 may comprise a first IDT unit 531, a second IDT unit 533, a third IDT unit 535, a fourth IDT unit 537 and a fifth IDT unit 539 arranged on the piezoelectric substrate 21 along the first direction A1 in order, and the floating units 45 are disposed between the third IDT unit 535 and the fourth IDT unit 537, and between the fourth unit 537 and the fifth unit 539 respectively. The floating unit 45 does not be disposed between the first IDT unit 531 and the second IDT unit 533, and between the second IDT unit 533 and the third IDT unit 535. Further, the first IDT configuration 42 only comprises an IDT unit 421, and thus it is unnecessary to dispose the floating unit on the IDT unit 421 or the first IDT configuration 42.

Figure 9:
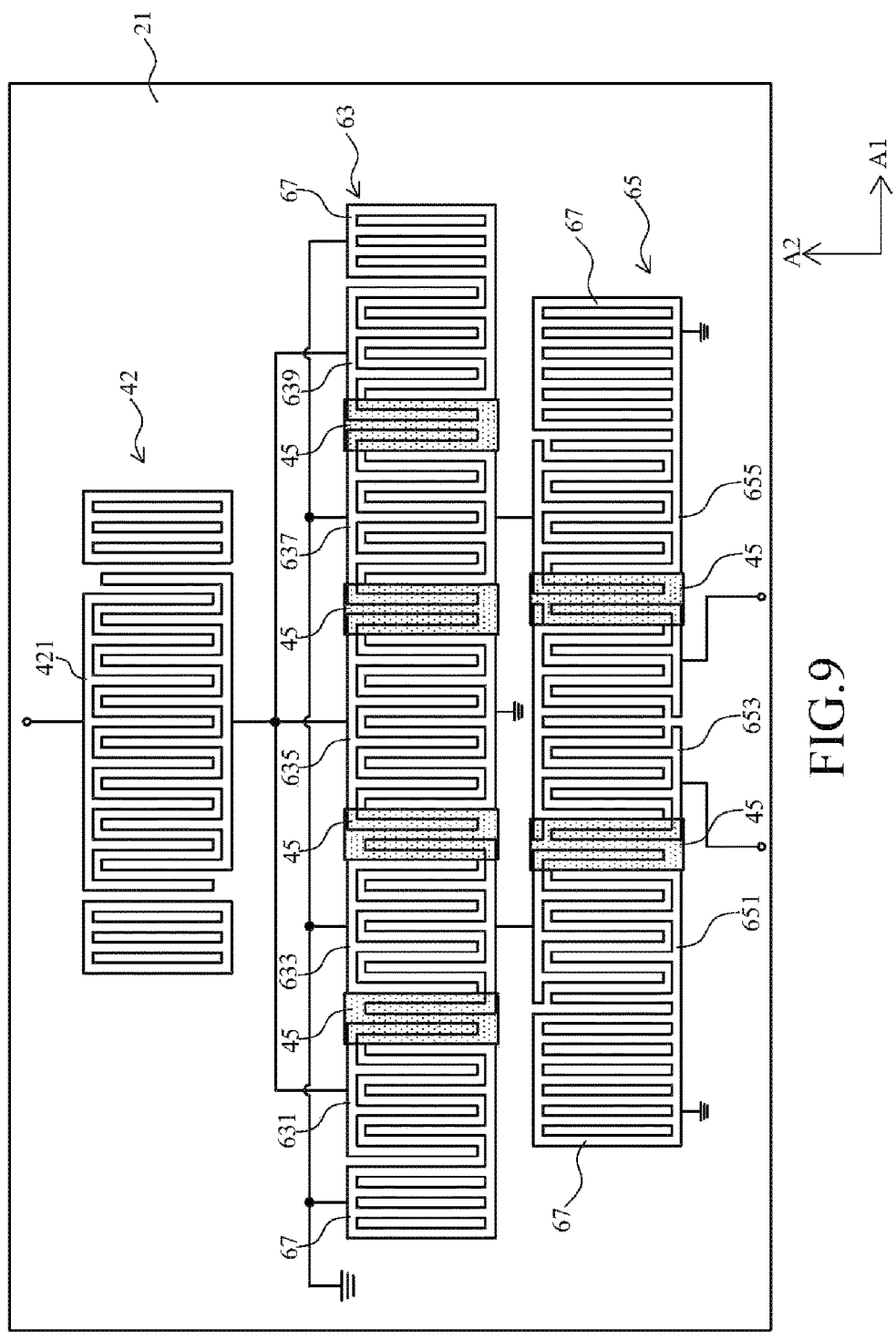
FIG. 9 is a perspective view diagram of a surface acoustic wave filter device according to a fifth embodiment of the invention.

FIG. 9 is a perspective view diagram of a surface acoustic wave filter device according to a fifth embodiment of the invention. The surface acoustic wave (SAW) filter device 60 comprises a piezoelectric substrate 21, a plurality of interdigitated transducer (IDT) configurations 42/63/65, at least one floating unit 45 and a plurality of grating reflectors 67.

In one embodiment of the invention, the IDT configurations may comprise a first IDT configuration 42, a second IDT configuration 63 and a third IDT configuration 65. Further, the first IDT configuration 42 may comprise one IDT unit 421, the second IDT configuration 63 may comprise a plurality of IDT units 631/633/635/637/639 arranged on the piezoelectric substrate 21 along the first direction A1 in order, and the third IDT configuration 65 may comprise a plurality of IDT units 651/653/655 arranged on the piezoelectric substrate 21 along the first direction A1 in order. For example, the first direction A1 is propagation direction of the surface acoustic wave, and IDT units 631/633/635/637/639/651/653/655 are arranged on the piezoelectric substrate 21 along propagation direction of the surface acoustic wave.

The first IDT configuration 42, the second IDT configuration 63 and the third IDT configuration 65 may be arranged on the piezoelectric substrate 21 along the second direction A2 in order, wherein the second direction A2 is be approximately perpendicular to the first direction A1 and/or the propagation direction of the surface acoustic wave. For example, the second IDT configuration 63 is arranged on the piezoelectric substrate 21 between the first IDT configuration 42 and the third IDT configuration 65. Thus, the SAW filter device 60 may be a longitudinally coupled-type SAW filter.

Further, each floating unit 45 is disposed between adjacent IDT units 631/633/635/637/639/651/653/655 of the second IDT configuration 63 and the third IDT configuration 65. In one embodiment of the invention, the second IDT configuration 63 may be a non-synchronous interdigital structure, and the third IDT configuration 65 may be a synchronous interdigital structure.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

What is claimed is:

1. A surface acoustic wave filter device, comprising:
   a piezoelectric substrate;
   at least one interdigitated transducer configuration including a plurality of interdigitated transducer units arranged on said piezoelectric substrate in order, each of said interdigitated transducer units defining a plurality of electrode fingers; and
   at least one floating unit disposed between adjacent interdigitated transducer units to partially cover each of said adjacent interdigitated transducer units;
   wherein said floating unit extends to fully overlap at least one electrode finger of each said adjacent interdigitated transducer unit partially covered thereby.

2. The surface acoustic wave filter device according to claim 1, wherein said interdigitated transducer configuration is connected to a voltage to generate a surface acoustic wave on said piezoelectric substrate, and said plurality of interdigitated transducer units are arranged on said piezoelectric substrate along a propagation direction of said surface acoustic wave.

3. The surface acoustic wave filter device according to claim 1, wherein at least one gap is formed between adjacent interdigitated transducer units, wherein said floating unit is disposed to span said gap to cover both said gap and a partial range of said adjacent interdigitated transducer units.

4. The surface acoustic wave filter device according to claim 3, wherein said floating unit includes an isolation layer covering said gap and said partial range of adjacent interdigitated transducer units, and a conductive layer is disposed on said isolation layer to overlap said partial range of said adjacent interdigitated transducer units.

5. The surface acoustic wave filter device according to claim 3, wherein said floating unit includes an isolation layer covering said gap and adjacent electrode fingers of said adjacent interdigitated transducer units, and a conductive layer is disposed on said isolation layer to overlap said adjacent electrode fingers of said adjacent interdigitated transducer units completely.

6. The surface acoustic wave filter device according to claim 3, wherein said interdigitated transducer units each include a plurality of electrode fingers, and said floating unit is disposed between said adjacent interdigitated transducer units to cover said gap and more than one of said plurality of electrode fingers of said adjacent interdigitated transducer units.

7. The surface acoustic wave filter device according to claim 1, wherein said interdigitated transducer configuration further includes at least two grating reflectors arranged on said piezoelectric substrate and disposed on two sides of said interdigitated transducer units that are arranged on said piezoelectric substrate in order respectively.

8. The surface acoustic wave filter device according to claim 7, wherein said at least two grating reflectors are connected to a closest one of said interdigitated transducer units respectively.

9. A surface acoustic wave filter device, comprising:
a piezoelectric substrate;
a plurality of interdigitated transducer configurations, at least one of said interdigitated transducer configurations including a plurality of interdigitated transducer units arranged on said piezoelectric substrate along a first direction in order, each of said interdigitated transducer units defining a plurality of electrode fingers, wherein said plurality of interdigitated transducer configurations are arranged on said piezoelectric substrate along a second direction in order, and said first direction is perpendicular to said second direction; and
a plurality of floating plates each disposed between adjacent ones of said interdigitated transducer units to partially cover each of said adjacent interdigitated transducer units;
wherein each said floating plate extends to fully overlap at least one electrode finger of each said adjacent interdigitated transducer unit partially covered thereby.

10. The surface acoustic wave filter device according to claim 9, wherein said interdigitated transducer configurations are connected to a voltage to generate a surface acoustic wave on said piezoelectric substrate, and said first direction defines a propagation direction of said surface acoustic wave.

11. The surface acoustic wave filter device according to claim 9, wherein said interdigitated transducer configurations are synchronous interdigital structures or non-synchronous interdigital structures.

12. The surface acoustic wave filter device according to claim 9 wherein said floating plates are disposed between all or parts of said adjacent interdigitated transducer units to cover at least a partial range thereof.

13. The surface acoustic wave filter device according to claim 9, wherein each said floating plate is disposed between said adjacent interdigitated transducer units to cover one or more than one of said electrode fingers of said adjacent interdigitated transducer units.

\* \* \* \* \*